United States Patent
Zhang et al.

(10) Patent No.: US 11,927,642 B2
(45) Date of Patent: *Mar. 12, 2024

(54) OPEN CELL DETECTION METHOD AND OPEN CELL RECOVERY DETECTION METHOD IN A BATTERY MANAGEMENT SYSTEM

(71) Applicant: O2Micro, Inc., Santa Clara, CA (US)

(72) Inventors: Yingguo Zhang, Wuhan (CN); Weidong Xue, Shanghai (CN); Xiaojun Zeng, Shanghai (CN)

(73) Assignee: O2Micro Inc., Santa Clara, CA (US)

( * ) Notice: Subject to any disclaimer, the term of this patent is extended or adjusted under 35 U.S.C. 154(b) by 438 days.

This patent is subject to a terminal disclaimer.

(21) Appl. No.: 17/325,048

(22) Filed: May 19, 2021

(65) Prior Publication Data
US 2021/0273462 A1 Sep. 2, 2021

Related U.S. Application Data

(63) Continuation of application No. 15/959,064, filed on Apr. 20, 2018, now Pat. No. 11,038,356.

(30) Foreign Application Priority Data

Apr. 24, 2017 (CN) .......................... 201710270590.3

(51) Int. Cl.
*G01R 31/396* (2019.01)
*G01R 31/36* (2020.01)
(Continued)

(52) U.S. Cl.
CPC ........... *G01R 31/396* (2019.01); *G01R 31/36* (2013.01); *H01M 10/425* (2013.01);
(Continued)

(58) Field of Classification Search
CPC ....... H02J 7/0019; H02J 7/0016; H02J 7/0036
See application file for complete search history.

(56) References Cited

U.S. PATENT DOCUMENTS

| 3,872,398 A | 3/1975 | Fausone et al. |
| 8,258,792 B2 | 9/2012 | Vandensande |

(Continued)

FOREIGN PATENT DOCUMENTS

| CN | 102809708 A | 12/2012 |
| KR | 101673248 B1 | 11/2016 |

OTHER PUBLICATIONS

"Safety of Lithium-Ion Battery—Principle, Design and Testing," written by De Cai Yang, and publised by University of Electronic Science and Technology of China Press, in May 2012. An English language summary is enclosed.

*Primary Examiner* — David V Henze-Gongola

(57) ABSTRACT

An open cell detection method includes: (a) generating a control signal by a control unit, to turn on a first balance switch for a first time period; (b) generating the control signal with the control unit, to turn off the first balance switch for a second time period; (c) measuring a voltage value on a first capacitor, with a measure unit; (d) if the voltage value on the first capacitor is less than an open cell threshold, then determining with the control unit that the first cell has an open cell failure; (e) for each cell of the cells, repeating steps (a)-(d); and (f) if at least one cell of the cells has an open cell failure, then determining with the control unit that the battery management system has an open cell failure.

20 Claims, 6 Drawing Sheets

(1) BEFORE THE OPEN CELL FAILURE (2) AFTER THE OPEN CELL FAILURE

(51) Int. Cl.
   *H01M 10/42* (2006.01)
   *H01M 10/44* (2006.01)
   *H01M 10/48* (2006.01)
   *H02J 7/00* (2006.01)

(52) U.S. Cl.
   CPC ....... *H01M 10/441* (2013.01); *H01M 10/482* (2013.01); *H02J 7/0019* (2013.01); *H02J 7/0036* (2013.01); *H01M 2010/4271* (2013.01); *H02J 7/0016* (2013.01); *H02J 7/0048* (2020.01)

(56) References Cited

U.S. PATENT DOCUMENTS

| | | |
|---|---|---|
| 2004/0036446 A1 | 2/2004 | Iwashima |
| 2004/0051534 A1 | 3/2004 | Kobayashi et al. |
| 2005/0029033 A1 | 2/2005 | Rip et al. |
| 2006/0139008 A1 | 6/2006 | Park |
| 2009/0174362 A1 | 7/2009 | Richardson et al. |
| 2009/0200993 A1 | 8/2009 | Maeda |
| 2009/0218988 A1 | 9/2009 | Richardson et al. |
| 2009/0309545 A1 | 12/2009 | Kunimitsu |
| 2010/0271052 A1 | 10/2010 | Ishikawa et al. |
| 2010/0297883 A1 | 11/2010 | Burlak et al. |
| 2011/0011653 A1 | 1/2011 | Mizutani et al. |
| 2011/0156626 A1 | 6/2011 | Mukai et al. |
| 2011/0260770 A1 | 10/2011 | Sekiguchi |
| 2012/0004873 A1 | 1/2012 | Li |
| 2012/0007603 A1 | 1/2012 | Zhang |
| 2012/0025835 A1* | 2/2012 | Chandler ................ B60L 58/22 324/433 |
| 2012/0146652 A1* | 6/2012 | Aoki .................... G01R 31/396 324/433 |
| 2013/0057294 A1 | 3/2013 | Mizoguchi et al. |
| 2013/0113280 A1 | 5/2013 | Yang et al. |
| 2014/0152261 A1 | 6/2014 | Yamauchi et al. |
| 2014/0225622 A1 | 8/2014 | Kudo et al. |
| 2014/0242422 A1 | 8/2014 | Hakansson et al. |
| 2014/0266003 A1 | 9/2014 | Biskup |
| 2014/0266050 A1 | 9/2014 | Biskup |
| 2014/0292345 A1 | 10/2014 | Matumoto et al. |
| 2015/0077124 A1 | 3/2015 | Suzuki |
| 2015/0260799 A1 | 9/2015 | Kuroda |
| 2016/0252587 A1 | 9/2016 | Kawanaka |
| 2016/0325005 A1 | 11/2016 | Wang et al. |
| 2017/0244259 A1 | 8/2017 | Tsuchiya et al. |
| 2017/0288428 A1 | 10/2017 | Ishikawa |
| 2019/0056453 A1 | 2/2019 | Matsubara et al. |
| 2019/0074699 A1 | 3/2019 | Yano et al. |
| 2019/0077124 A1 | 3/2019 | Shinbara |

* cited by examiner (1) BEFORE THE OPEN CELL FAILURE (2) AFTER THE OPEN CELL FAILURE

OPEN CELL DETECTION METHOD AND OPEN CELL RECOVERY DETECTION METHOD IN A BATTERY MANAGEMENT SYSTEM

RELATED APPLICATIONS

This application is a Continuation Application of the co-pending commonly-owned U.S. patent application Ser. No. 15/959,064, filed on Apr. 20, 2018, now U.S. Pat. No. 11,038,356, which claims priority to Chinese Patent Application No. 201710270590.3, titled "Open Cell Detection Method and Open Cell Detection Recovery Method in Battery Management System," filed on Apr. 24, 2017, with the State Intellectual Property Office of the People's Republic of China, both of which are hereby incorporated by reference in their entirety.

BACKGROUND

A multi-cell battery pack usually includes multiple cells (e.g., Li-ion cells) connected in series to supply electric power to an electric vehicle, a household electrical appliance, etc. To monitor the status of the battery pack and to balance the cell voltages, the battery pack usually includes a battery management system (Battery Management System, BMS). The BMS includes: a multiplexer (MUX), for selecting any of the cells; a voltage measure module, for measuring the voltages at the two ends of the selected cell, detecting the cell voltage in real time, and detecting whether there is an over-voltage (OV) or under-voltage (UV) situation; and a cell balance module, for balancing the cells. The cell balance module can balance each cell voltage by generating a balance current from the corresponding cell to the balance resistor. For example, if the voltage value of a certain cell is greater than that of other cells, then the corresponding balance switch is closed to connect to the balance resistor in parallel with that cell and to perform a discharge operation on that cell, to balance the cell voltages in the battery.

The accuracy of the cell voltage measurement depends on whether the connection between the BMS and the cell is robust or not. Usually, nickel straps or electric wires are used for the connections. At the cell side, the nickel strap or the electric wire is soldered to the cell tap. At the BMS side, the nickel strap is directly soldered to a printed circuit board (PCB), and the electric wire is connected to the PCB via a connector. However, sometimes the connection between the BMS and a cell may degrade or break, causing an open cell failure (Cell Tap Open or Open Cell). Once an open cell failure occurs, the cell voltage measurement becomes inaccurate. Therefore, it is not possible to achieve timely and accurate battery management functions. For example, in one scenario, when the voltage of a certain cell is greater than an OV threshold, the BMS should perform an OV protection operation. However, when the OV situation cannot be detected due to an open cell failure in the BMS, the OV protection operation cannot be performed. For example, in another scenario, all cell voltages are normal but, due to the open cell failure in the BMS, the BMS improperly and unnecessarily performs the OV or UV protection operation. Therefore, there is a need for an improved open cell detection method in the BMS, for quickly detecting an open cell failure in the battery management system, detecting whether the open cell failure is recovered, and efficiently avoiding situations when an open cell failure is not detected or is incorrectly identified as being present.

SUMMARY

To solve the above-mentioned problems, embodiments according to the present invention provide an open cell detection method in a battery management system. In these embodiments, the battery management system includes monitoring resistors corresponding to cells, capacitors, balance switches and balance resistors, where a first cell of the cells corresponds to a first monitoring resistor, a second monitoring resistor, a first capacitor, a first balance switch, and a first balance resistor. In these embodiments, the open cell detection method includes the following steps: (a) generating a control signal with a control unit, to turn on the first balance switch for a first time period; (b) generating the control signal with the control unit, to turn off the first balance switch for a second time period; (c) measuring a voltage value on the first capacitor, with a measure unit coupled to the control unit; (d) if the voltage value on the first capacitor is less than an open cell threshold, then determining with the control unit that the first cell has an open cell failure; (e) for each cell of the cells, repeating steps (a)-(d); and (f) if at least one cell of the cells has an open cell failure, then determining with the control unit that the battery management system has the open cell failure.

Embodiments according to the present invention also provide an open cell recovery detection method in a battery management system. In these embodiments, the battery management system includes monitoring resistors corresponding to cells, capacitors, balance switches and balance resistors, where a first cell of the cells corresponds to a first monitoring resistor, a second monitoring resistor, a first capacitor, a first balance switch, and a first balance resistor. In these embodiments, the open cell recovery detection method includes the following steps: (a) generating a control signal with a control unit, to turn on the first balance switch for a first time period; (b) generating the control signal by the control unit, to turn off the first balance switch for a second time period; (c) measuring a voltage value on the first capacitor, with a measure unit coupled to the control unit; (d) if the voltage value on the first capacitor is greater than or equal to an open cell threshold, then determining with the control unit that the first cell does not have an open cell failure; (e) for each cell of the cells, repeating steps (a)-(d); and (f) if all the cells do not have an open cell failure, then determining with the control unit that an open cell failure of the battery management system has been recovered.

Advantageously, the open cell detection method and the open cell recovery detection method in a battery management system according to the present invention can quickly detect an open cell failure in the battery management system, detect whether an open cell failure is recovered, and efficiently avoid missing an open cell failure or incorrectly identifying the existence of an open cell failure.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computing system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "generating," "determining," "clearing," "disabling," or the like, refer to actions and processes (e.g., the flowcharts of FIGS. 4A, 4B, 5A, and 5B) of a computing system or similar electronic computing device or processor. The computing system or similar electronic computing device manipulates and transforms data represented as physical (electronic) quantities within the computing system memories, registers or other such information storage, transmission or display devices.

Figure 1:
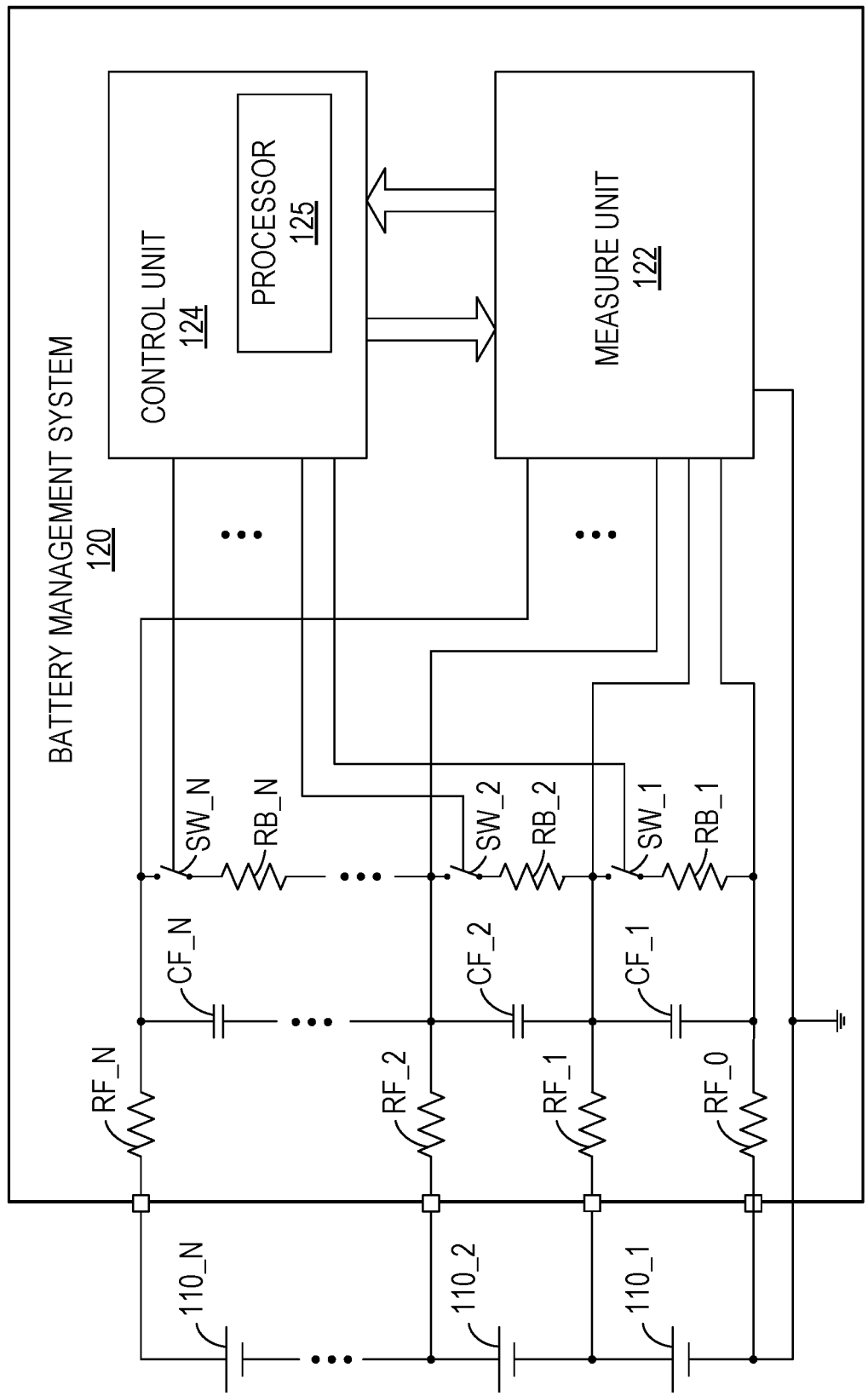
FIG. 1 shows a block diagram of a battery management system according to an embodiment of the present invention.

FIG. 1 shows a block diagram of a battery management system 120 according to an embodiment of the present invention. As shown in FIG. 1, the battery management system 120 can be configured to manage N cells 110_1-110_N (N is an integer greater than 2), including monitoring the voltage value of each cell in real time and detecting whether there is an over-voltage (OV) or under-voltage (UV) situation. In one embodiment, the cell 110_1 is referred to as the bottommost cell (i.e., the battery nearest to the reference ground of the battery management system 120) and the cell 110_N is referred to the topmost cell (i.e., the battery farthest from the reference ground), and vice versa. This is not a limitation of the present invention.

The battery management system 120 can include N+1 monitoring resistors RF_0-RF_N, respectively coupled to a positive and/or negative electrode of the corresponding cell of the cells 110_1-110_N, for monitoring the voltage value of the positive or negative electrode of the corresponding cell of the cells 110_1-110_N. For example, the monitoring resistor RF_0 is coupled to the negative electrode of the cell 110_1, and the monitoring resistor RF_1 is coupled to the positive electrode of the cell 110_1 and the negative electrode of the cell 110_2, and so on.

The battery management system 120 can further include N capacitors CF_1-CF_N. The capacitor CF_1 is coupled between the monitoring resistors RF_0 and RF_1, the capacitor CF_2 is coupled between the monitoring resistors RF_1 and RF_2, the capacitor CF_N is coupled between the monitoring resistors RF_N−1 and RF_N, and so on. The monitoring resistors RF_0-RF_N and capacitors CF_1-CF_N form RC filters, to eliminate unwanted noise components from the voltage measurement.

In an embodiment, the battery management system 120 includes a measure unit 122, coupled to the monitoring resistors RF_0-RF_N, and configured to monitor the cell voltage of the cells 110_1-110_N in real time. For example, the measure unit 122 can calculate the cell voltage of the cell 110_1 according to the voltages at the two ends of the cell 110_1 sensed by the monitoring resistors RF_0 and RF_1 (i.e., the voltage value of the positive and negative electrodes of the cell 110_1). In an embodiment, a control unit 124 is coupled to the measure unit 122 and is configured to receive the measured cell voltage of the cells 110_1-110_N from the measure unit 122, determine whether one of the cells (e.g., cell 110_1) is unbalanced according to the N cell voltages, and generate a control signal to the corresponding balance switch (e.g., SW_1) to control the state (on/off) of the balance switch (e.g., SW_1). In one embodiment, the control unit 124 includes a processor 125 that executes a set of instructions stored in a memory coupled to the processor to perform its functions. The measure unit 122 includes analog/digital converters (ADC) that converts the measured cell voltage of the cells to digital format before they are transmitted to the control unit 124.

As shown in the embodiment of FIG. 1, the battery management system 120 includes N balance switches SW_1-SW_N and N balance resistors RB_1-RB_N. The balance switches and the balance resistors can serve as a cell balancing circuit. Specifically, for example, the measure unit 122 measures the cell voltages V1 and V2 (e.g., 12.4 V and 12 V) of the cells 110_1 and 110_2, respectively. When the voltage difference $\Delta V_{1-2}$ between the cells 110_1 and 1102 (e.g., 0.4 V) is greater than a threshold VTH (e.g., 0.1 V), the control unit 124 determines that the voltage difference between the cells 110_1 and 110_2 is unbalanced. Under the control of the control unit 124, the balance switches SW_1, SW_2 and the balance resistors RB_1, RB_2 work together to adjust and balance the voltage values of the two cells 110_1 and 110_2, to make the voltage difference $\Delta V_{1-2}$ between the cells 110_1 and 1102 equal to or less than the threshold VTH. In one embodiment, the control unit 124 generates a control signal to turn on the balance switch SW_1 and to turn off the balance switch SW_2. During a discharging process, a discharging current will flow through the balance resistor RB_1 and perform a discharge operation on the cell 110_1, until the voltage difference $\Delta V_{1\text{-}2}$ is balanced between the cells 110_1 and 110_2 (e.g., the voltage difference $\Delta V_{1\text{-}2}$ between the cells 110_1 and 110_2 is less than the threshold VTH). During a charging process, the bypass current will flow through the balance resistor RB_1 and bypass the cell 110_1, until the voltage difference $\Delta V_{1\text{-}2}$ is balanced between the cells 110_1 and 110_2.

In one embodiment, if the voltage difference between multiple cells is unbalanced, then the control unit 124 calculates the voltage differences between pairs of those cells, and sets different priorities for those voltage differences. For example, the largest voltage difference is set to have the highest priority, and the smallest voltage difference is set to have the lowest priority. If two or more voltage differences are the same, then those voltage differences can be set to have the same priority. The control unit 124 can adjust the unbalanced cells according to the priorities. In one embodiment, if two or more voltage differences have the same priority, then the control unit 124 simultaneously controls the corresponding balance switches and balance resistors to adjust the unbalanced cells. In another embodiment, if the battery management system 120 utilizes a cooler or fan to reduce temperature (an over-temperature problem), then the control unit 124 does not need to determine and/or set the priorities of the voltage differences, and instead adjusts all the unbalanced cells at the same time. The above embodiments are only for illustrative purposes, without limiting the present invention.

Advantageously, the control unit 124 in the battery management 120 can monitor the unbalanced cells among the cells 110_1-110_N in real time, and can control the corresponding balancing circuits to adjust the unbalanced cell voltages. Therefore, the above actions can be taken to prevent the battery capacity from dropping too fast.

Figure 2:
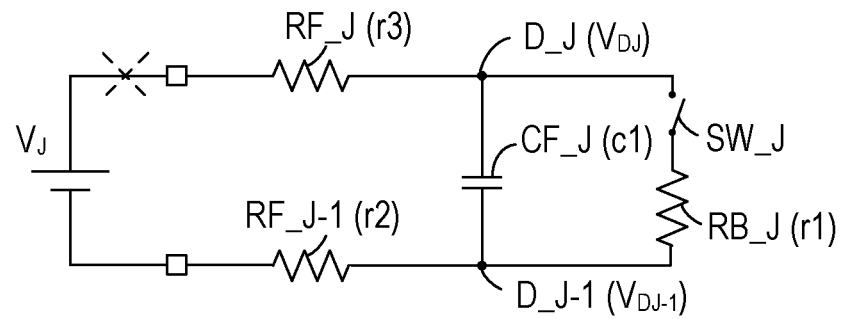
FIG. 2 shows a diagram of the open cell detection circuit of a cell in a battery management system according to an embodiment of the present invention.
Figure 3:
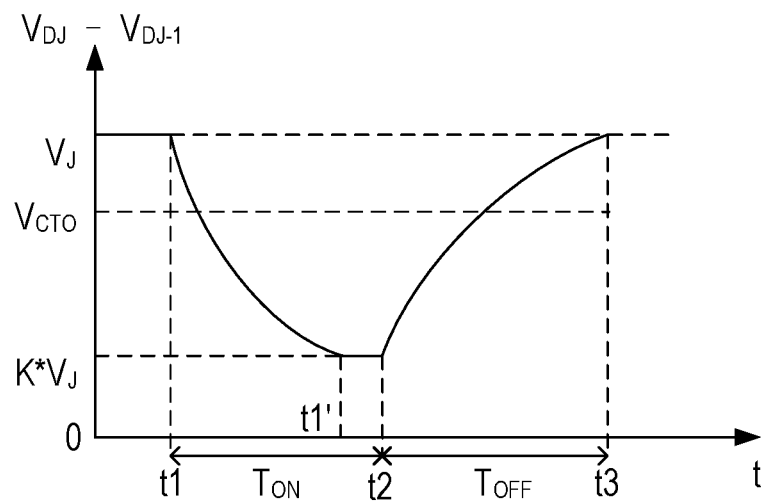
FIG. 3 shows the voltage changes as a function of time before and after an open cell failure according to an embodiment of the present invention.
Figure 3:
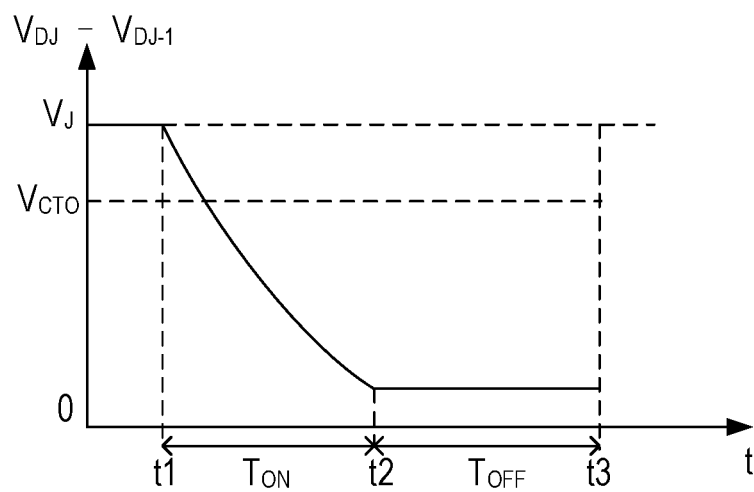

FIG. 2 shows a diagram of an open cell detection circuit of one cell 110_J (J is an integer between 1 and N) in the battery management system 120 of FIG. 1. FIG. 3 shows the voltage change as a function of time of the nodes D_J and D_J−1 at two ends of the capacitor CF_J before and after an open cell failure. As shown in FIG. 2 and FIG. 3, the cell voltage of the cell 110_J is labeled as $V_J$, the voltage value of the node D_J−1 is labeled as $V_{DJ\text{-}1}$, and the voltage value of the node D_J is labeled as $V_{DJ}$. Furthermore, the resistance value of the resistor RB_J is labeled as r1, the resistance value of the resistor RF_J−1 is labeled as r2, the resistance value of the resistor RF_J is labeled as r3, and the capacitance value of the capacitor CF_J is labeled as c1.

Before an Open Cell Failure—Situation (1)

During the time period of 0-t1, the balance switch SW_J is turned off, and the voltage value on the capacitor CF_J (i.e., $V_{DJ}\text{-}V_{DJ\text{-}1}$) is equal to the cell voltage $V_J$.

At time t1, the balance switch SW_J is turned on, the capacitor CF_J starts its discharge process, and the voltage on the capacitor CF_J gradually decreases. At that time, the resistor RB_J and the resistors RF_J and RF_J−1 serve as a voltage divider circuit.

During the time period of t1' to t2, the voltage divider circuit enters a stable state. During this time period, the voltage on the capacitor CF_J is always $K*V_J$, where K is the ratio of the resistance value of the resistor RB_J to the sum of the resistance values of the resistors RB_J, RF_J, RF_J−1: K=r1/(r1+r2+r3).

At time t2, the balance switch SW_J is turned off, the cell 110_J starts to charge the capacitor CF_J, and the voltage on the capacitor CF_J gradually increases.

At time t3, the voltage on the capacitor CF_J increases to the cell voltage $V_J$, and then enters the stable state.

As shown in FIG. 3, during the time period $T_{ON}$ of t1 to t2, the balance switch SW_J is turned on. During the time period $T_{OFF}$ of t2 to t3, the balance switch SW_J is turned off.

After an Open Cell Failure—Situation (2)

The dotted lines in FIG. 2 indicate an open cell failure between the cell 110_J and the right side of the circuit. The battery management system 120 is tested for open cell failures before delivery (e.g., in the factory) and/or at delivery, and so it can be assumed that the battery management system 120 does not have a pre-existing open cell failure. Moreover, before the open cell failure, the cell 110_J functions to charge the capacitor CF_J.

During the time period of 0-t1, the balance switch SW_J is turned off, and the voltage value on the capacitor CF_J (i.e., $V_{DJ}\text{-}V_{DJ\text{-}1}$) is equal to the cell voltage $V_J$.

At time t1, the balance switch SW_J is turned on, the capacitor CF_J starts its discharge process, and the voltage on the capacitor CF_J gradually decreases. Unlike situation (1) (before the open cell failure), because there is an open cell failure between the cell 110_J and the right side of the circuit, the resistor RB_J and the resistors RF_J and RF_J−1 cannot serve as the voltage divider circuit and so enter the stable state. Therefore, the voltage on the capacitor CF_J can continuously decrease. If the time period $T_{ON}$ of t1 to t2 is long enough, then the voltage on the capacitor CF_J can drop to zero.

At time t2, the balance switch SW_J is turned off. Unlike situation (1), because there is an open cell failure between the cell 110_J and the right side of the circuit, the cell 110_J cannot charge the capacitor CF_J again. Therefore, the voltage on the capacitor CF_J cannot increase. For example, the voltage on the capacitor CF_J at time t3 is still equal to the voltage on the capacitor CF_J at time t2. As can be seen by the changes in the voltages over time of situation (1) and situation (2) (FIG. 3), the battery management system (e.g., the control unit 124) can determine whether the cell 110_J has an open cell failure by comparing the voltage on the capacitor CF_J at time t3 and the preset open cell threshold $V_{CTO}$. For example, if the voltage on the capacitor CF_J at time t3 is less than the preset open cell threshold $V_{CTO}$, then it is determined that the cell 110_J has an open cell failure. On the other hand, if the voltage on the capacitor CF_J at time t3 is greater than or equal to the preset open cell threshold $V_{CTO}$, then it is determined that the cell 110_J does not have an open cell failure.

The length of the time period $T_{ON}$ is set so that, after the open cell failure, the capacitor CF_J is fully discharged, or nearly so, during the time period $T_{ON}$. For example, the voltage $V_{DJ}\text{-}V_{DJ\text{-}1}$ on the capacitor CF_J at time t2 is close to zero. After the open cell failure, the time constant τ1 of the discharging circuit composed of the capacitor CF_J and the resistor RB_J is equal to r1*c1. In an embodiment, the time period $T_{ON}$ is set to be between three times and five times the time constant τ1: $T_{ON}$=3*τ1, . . . , 5*τ1.

The length of the time period $T_{OFF}$ is set so that, before the open cell failure, the voltage $V_{DJ}\text{-}V_{DJ\text{-}1}$ on the capacitor CF_J at time t3 is greater than or equal to the preset open cell threshold $V_{CTO}$, and so that, after the open cell failure, the voltage $V_{DJ}-V_{DJ-1}$ on the capacitor CF_J at time t3 is less than the open cell threshold $V_{CTO}$. In other words, at time t3, if there is no open cell failure, then $V_{DJ}-V_{DJ-1}>V_{CTO}$; and if there is an open cell failure, then $V_{DJ}-V_{DJ-1}<V_{CTO}$. In this way, it can be determined whether there is an open cell failure using the voltage $V_{DJ}-V_{DJ-1}$ on the capacitor CF_J at time t3. Before the open cell failure, the time constant τ2 of the charging circuit (the capacitor CF_J and the resistors RF_J and RF_J−1) is equal to τ2=(r2+r3)*c1. In an embodiment, the time period $T_{OFF}$ is set to be between three times and five times of the time constant τ2: $T_{OFF}$=3*τ2, . . . , 5*τ2.

The open cell threshold $V_{CTO}$ is set to avoid missing or incorrectly identifying the existence of an open cell failure. For example, in situation (2), the voltage on the capacitor CF_J is constant during the time period $T_{OFF}$ when the charging current from the current leakage path of the battery management system 120 to the capacitor CF_J is negligible. However, in actual practice, due to the current leakage path, the voltage on the capacitor CF_J can slowly increase. If the open cell threshold $V_{CTO}$ is too low, then the open cell failure may not be detected. Furthermore, the open cell threshold $V_{CTO}$ should be less than the cell voltage of each cell ($V_{CTO}<V_J$); otherwise, it may cause an open cell failure to be incorrectly identified as existing when the cell voltage is relatively low. In actual practice, each cell of the battery pack has a low battery protection threshold $V_{MIN}$, to avoid unrecoverable damage due to a very low cell voltage (e.g., 0). Considering these factors, in an embodiment, the open cell threshold $V_{CTO}$ is set to be between ⅗ and 9/10 of the low battery protection threshold $V_{MIN}$: $V_{CTO}$=(⅗)*$V_{MIN}$, . . . , (9/10)*$V_{MIN}$.

Figure 4A:
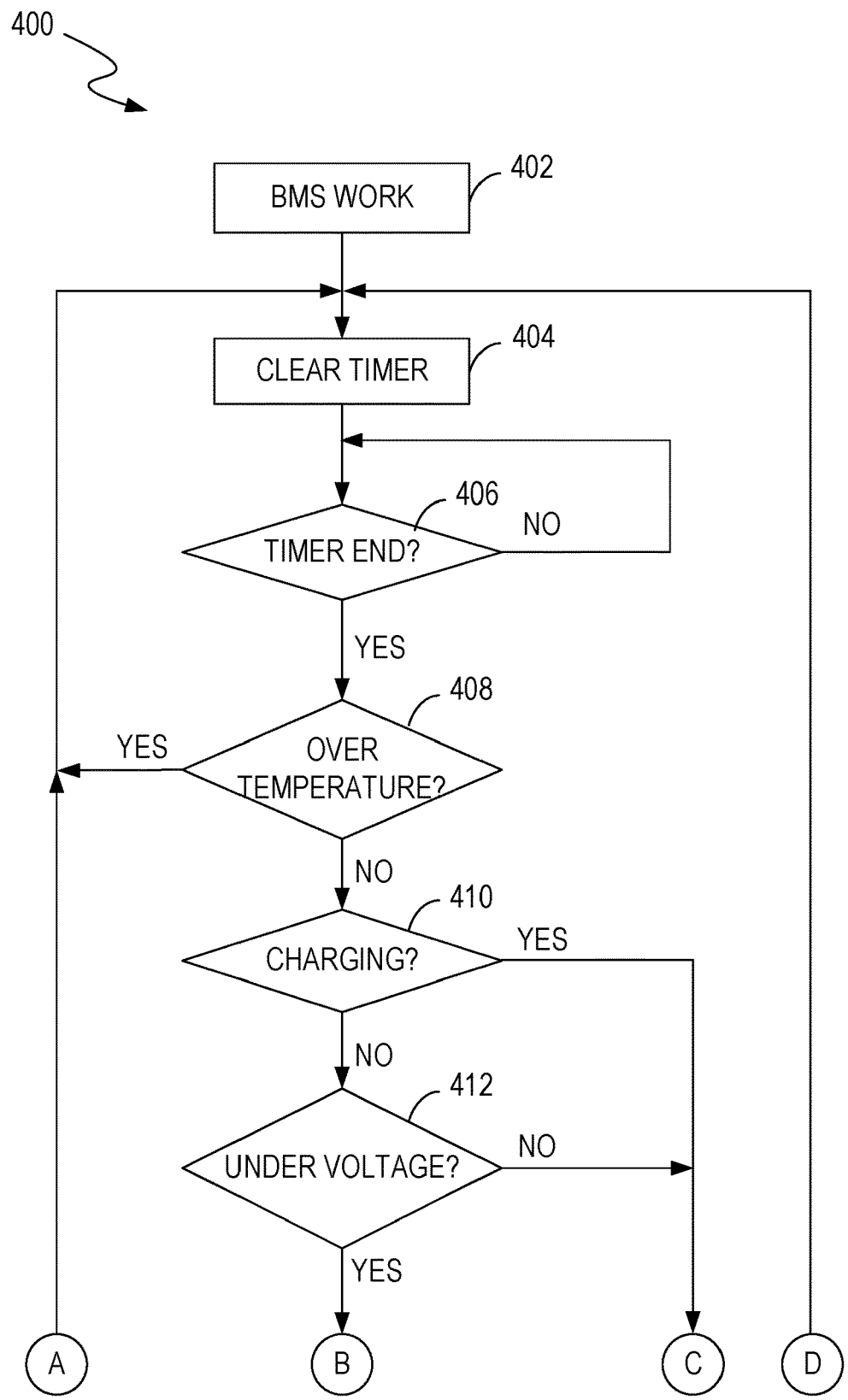
FIG. 4A and FIG. 4B are flowcharts of an open cell detection method according to an embodiment of the present invention.
Figure 4B:
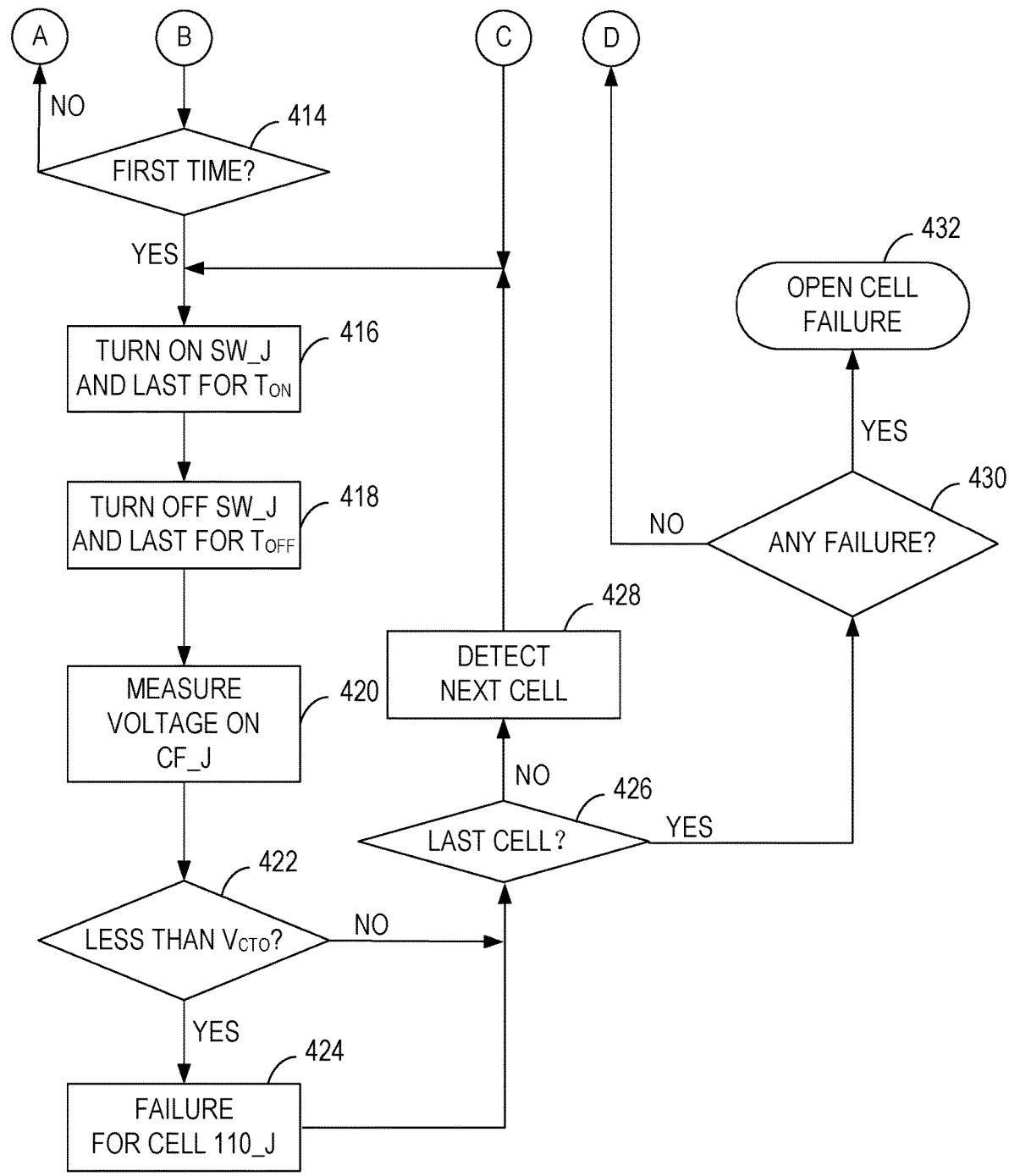

FIG. 4A and FIG. 4B are flowcharts of an open cell detection method 400 according to an embodiment of the present invention.

In block 402, the battery management system (e.g., the battery management system 120) starts to work.

In block 404, the control unit 124 clears an open cell detection timer (e.g., the timer returns to zero).

In block 406, the control unit 124 determines whether the open cell detection timer has ended (e.g., whether the time period expires).

In block 408, if the open cell detection timer has ended, then the control unit 124 further determines whether there is an over-temperature problem. If there is an over-temperature problem, then the control unit 124 stops the open cell detection process, and the method returns to block 404.

In block 410, if there is not an over-temperature problem, then the control unit 124 further determines whether the battery (e.g., the cells 110_1 to 110_N) is being charged. If the battery is being charged (e.g., a charger is plugged into the battery or an electric power source), then the method goes to block 416.

In block 412, if the battery is not being charged (e.g., the charger is unplugged), then the control unit 124 further determines whether there is an under-voltage situation. If there is not an under-voltage situation, then the method goes to block 416.

In block 414, if there is an under-voltage situation, then the control unit 124 further determines whether it is the first time the under-voltage situation has occurred since the charger was unplugged. If it is not the first time, which means the battery is in a persistent under-voltage situation, then the control unit 124 stops the open cell detection process, and the method returns to block 404. At the same time, the battery management system 120 can generate an under-voltage alarm, to remind an operator to plug in the charger again and charge the battery. If the determination result in block 414 is "yes," then the method goes to block 416. If it is the first time that an under-voltage situation has occurred, then it may be a false under-voltage situation due to an open cell failure, and the method goes to block 416.

In block 416, the control unit 124 generates a control signal to turn on the balance switch SW_J for a time period $T_{ON}$. For example, during the time period $T_{ON}$ of t1 to t2 in FIG. 3, the control unit 124 generates a high-level control signal (e.g., logic "1") to turn on the balance switch SW_J. In an embodiment, the time period $T_{ON}$ is set to be between three times and five times the time constant τ1 ($T_{ON}$=3*τ1, . . . , 5*τ1), where the time constant τ1 of the discharging circuit (composed of the capacitor CF_J and the resistor RB_J) is equal to r1*c1.

In block 418, the control unit 124 generates a control signal to turn off the balance switch SW_J for a time period $T_{OFF}$. For example, during the time period $T_{OFF}$ of t2 to t3 in FIG. 3, the control unit 124 generates a low-level control signal (e.g., logic "0") to turn off the balance switch SW_J. In an embodiment, the time period $T_{OFF}$ is set to be between three times and five times the time constant τ2 ($T_{OFF}$=3*τ2, . . . , 5*τ2), where the time constant τ2 of the charging circuit (composed of the capacitor CF_J and the resistors RF_J and RF_J−1) is equal to τ2=(r2+r3)*c1.

In block 420, the measure unit 122 measures the voltage value on the balance capacitor CF_J, i.e., $V_{DJ}-V_{DJ-1}$.

In block 422, the control unit 124 determines whether the measured voltage is less than the open cell threshold $V_{CTO}$. In an embodiment, the open cell threshold $V_{CTO}$ is set to be between ⅗ and 9/10 of the low battery protection threshold $V_{MIN}$ ($V_{CTO}$=(⅗)*$V_{MIN}$, . . . , (9/10)*$V_{MIN}$). For example, at time t3 of FIG. 3, if there is no open cell failure, then $V_{DJ}-V_{DJ-1}>V_{CTO}$. When the determination result is "no," the method goes to block 426 and otherwise goes to block 424.

In block 424, if the measured voltage is less than the open cell threshold $V_{CTO}$, then the control unit 124 determines that the cell 110_J has an open cell failure, and the method goes to block 426. For example, at time t3 of FIG. 3, if there is an open cell failure, then $V_{DJ}-V_{DJ-1}<V_{CTO}$.

In block 426, the control unit 124 determines whether the cell 110_J is the last cell (e.g., whether J is equal to N). In one embodiment, the cell 110_1 is referred to as the bottommost cell (i.e., the battery nearest to the reference ground) and the cell 110_N is referred to as the topmost cell (i.e., the battery farthest from the reference ground). In another embodiment, the cell 110_1 is referred to the topmost cell (i.e., the battery farthest from the reference ground) and the cell 110_N is referred to the bottommost cell (i.e., the battery nearest to the reference ground). This is not a limitation of the present invention.

In block 428, if the cell 110_J is not the last cell (e.g., J is not equal to N), then the control unit 124 continues to the next cell.

For example, for the case where the cell 110_1 is the bottommost cell and the cell 110_N is the topmost cell, the open cell detection method starts from the bottommost cell 110_1, and repeats blocks 416 to 428 from bottom to top, to the cell 110_2, the cell 1103, and so on. When it is determined in block 426 that the cell 110_J is the last cell (e.g., J is equal to N), the method continues to block 430. For the case where the cell 110_1 is the topmost cell and the cell 110_N is the bottommost cell, the open cell detection method starts from the topmost cell 110_1, and repeats blocks 416 to 428 from top to bottom, to the cell 110_2, the cell 1103, and so on. When it is determined in block 426 that the cell 110_J is the last cell (e.g., J is equal to N), the method continues to block 430.

In block 430, the control unit 124 determines whether any cell of the cell 110_1 to 110_N has an open cell failure. If none of the cells have an open cell failure, then the method returns to block 404.

In block 432, if at least one cell has an open cell failure, then the control unit 124 determines that the battery management system 120 has an open cell failure.

Correspondingly, after determining that there is an open cell failure, the battery management system 120 can send an open cell alarm to, for example, a microcontroller unit (MCU; not shown), to alert the operator to address the open cell failure by, for example, resoldering the nickel strap or changing the connector.

Figure 5A:
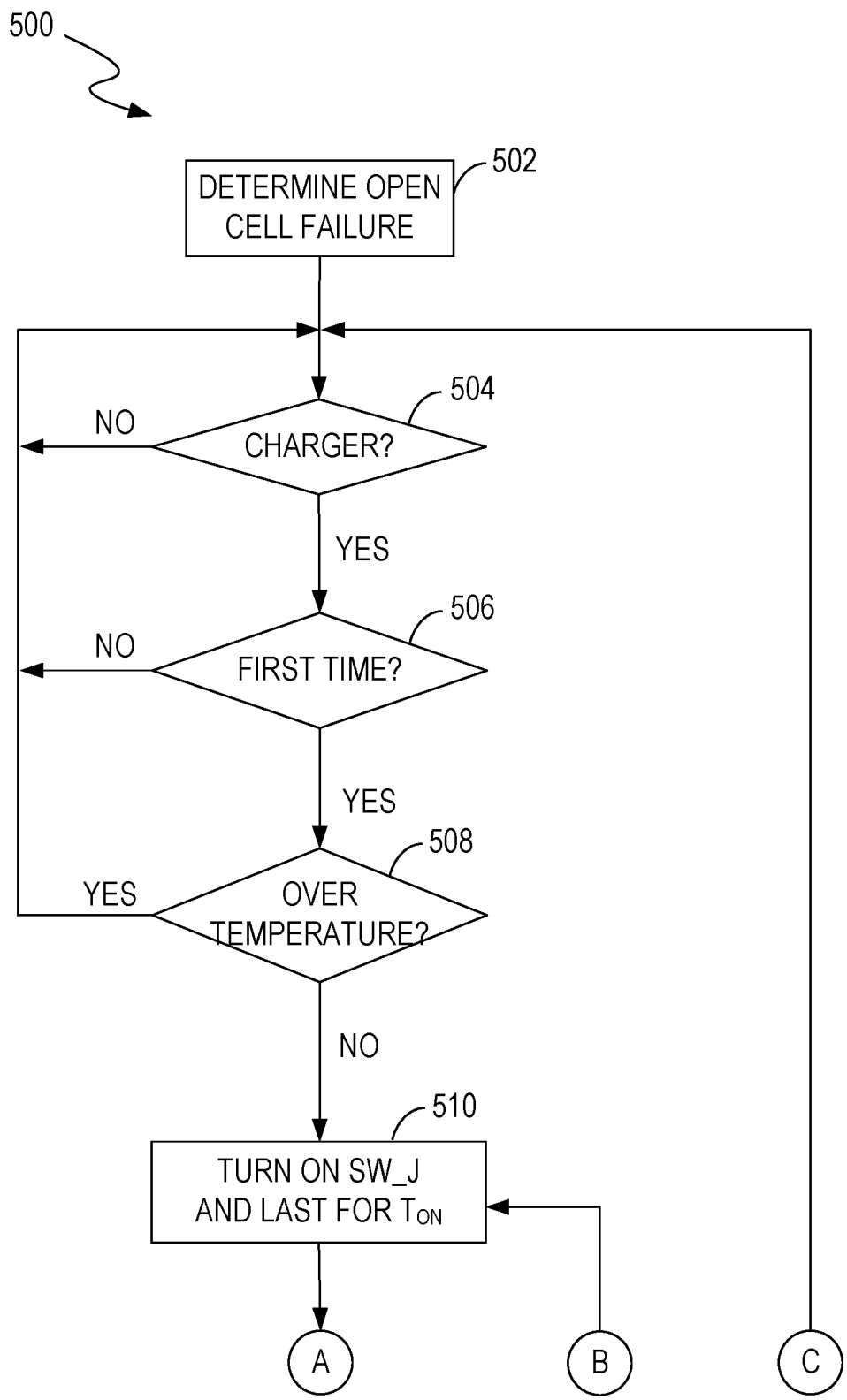
FIG. 5A and FIG. 5B are flowcharts of an open cell recovery detection method according to an embodiment of the present invention.
Figure 5B:
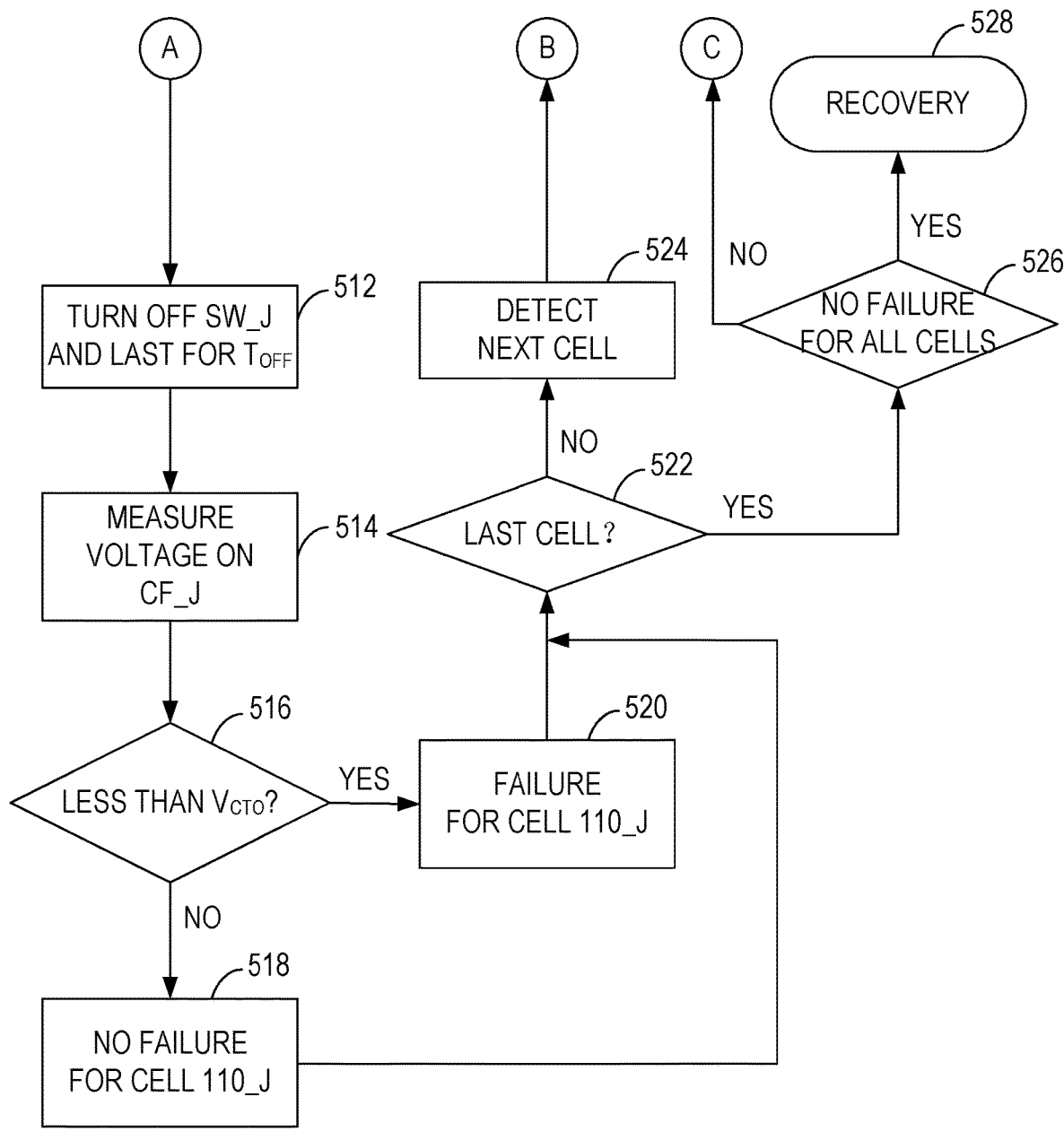

FIG. 5A and FIG. 5B show flowcharts of an open cell recovery detection method 500 according to an embodiment of the present invention. If all the cells do not have an open cell failure, then the open cell failure of the battery management system 120 has been recovered.

In block 502, the control unit 124 determines that there is an open cell failure. Then, the battery management system 120 disables the charging of the battery (e.g., the cells 110_1 to 110_N) and alerts the operator to unplug the charger.

In block 504, the control unit 124 detects whether the charger is plugged in.

In block 506, if the charger is plugged in, then the control unit 124 further detects whether it is the first time that the charger is plugged in since the charger was last unplugged. If it is not the first time, then the method returns to block 504, without determining whether the open cell failure has been recovered.

In block 508, if it is the first time, then the control unit 124 further determines whether there is an over-temperature problem. If there is an over-temperature problem, the control unit 124 stops the open cell recovery process, and the method returns to block 504.

During the open cell recovery detection method, the battery management system 120 can disable the charging of the battery. If it is detected that there is an under-voltage situation, then the battery management system 120 can disable the discharging of the battery. Once the battery cannot be charged or discharged, it cannot be used anymore. To avoid that issue, in one embodiment, the open cell recovery detection method 500 does not include the step of further detecting whether the battery has an under-voltage problem.

In block 510, the control unit 124 generates a control signal to turn on the balance switch SW_J for a time period $T_{ON}$. For example, during the time period $T_{ON}$ of t1 to t2 in FIG. 3, the control unit 124 generates a high level control signal (e.g., logic "1") to turn on the balance switch SW_J. In an embodiment, the time period $T_{ON}$ is set to be between three times and five times the time constant $\tau 1$ ($T_{ON}= 3*\tau 1, \ldots, 5*\tau 1$), where the time constant $\tau 1$ of the discharging circuit (composed of the capacitor CF_J and the resistor RB_J) is equal to r1*c1.

In block 512, the control unit 124 generates a control signal to turn off the balance switch SW_J for a time period $T_{OFF}$. For example, during the time period $T_{OFF}$ of t2 to t3 in FIG. 3, the control unit 124 generates a low level control signal (e.g., logic "0") to turn off the balance switch SW_J. In an embodiment, the time period $T_{OFF}$ is set to be between three times and five times the time constant $\tau 2$ ($T_{OFF}= 3*\tau 2, \ldots, 5*\tau 2$), where the time constant $\tau 2$ of the charging circuit (composed of the capacitor CF_J and the resistors RF_J and RF_J−1) is equal to $\tau 2=(r2+r3)*c1$.

In block 514, the measure unit 122 measures the voltage value on the balance capacitor CF_J, i.e., $V_{DJ}-V_{DJ-1}$.

In block 516, the control unit 124 determines whether the measured voltage is less than the open cell threshold $V_{CTO}$. In an embodiment, the open cell threshold $V_{CTO}$ is set to be between 3/5 and 9/10 of the low battery protection threshold $V_{MIN}$: ($V_{CTO}=(3/5)*V_{MIN}, \ldots, (9/10))*V_{MIN}$).

In block 518, if the measured voltage is greater than the open cell threshold $V_{CTO}$, then the control unit 124 determines that the cell 110_J does not have an open cell failure, and the method goes to block 522. For example, at time t3 of FIG. 3, if there is not an open cell failure, then $V_{DJ}-V_{DJ-1}>V_{CTO}$.

In block 520, if the measured voltage is less than open cell threshold $V_{CTO}$, then the control unit 124 determines that the cell 110_J still has an open cell failure, and the method goes to block 522. For example, at time t3 of FIG. 3, if there is an open cell failure, then $V_{DJ}-V_{DJ-1}<V_{CTO}$.

In block 522, the control unit 124 determines whether the cell 110_J is the last cell (e.g., J is equal to N). In one embodiment, the cell 110_1 is referred to the bottommost cell and the cell 110_N is referred to the topmost cell, or vice versa, as described above. This is not a limitation of the present invention.

In block 524, if the cell 110_J is not the last cell (e.g., J is not equal to N), then the control unit 124 continues to the next cell.

For example, in the case in which the cell 110_1 is the bottommost cell and the cell 110_N is the topmost cell, the detection process starts from the bottommost cell 110_1, and repeats blocks 510 to 524 from bottom to top, to the cell 110_2, the cell 110_3, and so on. When it is determined in block 522 that the cell 110_J is the last cell (e.g., J is equal to N), the method goes to block 526. In the case in which the cell 110_1 is the topmost cell and the cell 110_N is the bottommost cell, then the detection process starts from the topmost cell 110_1, and repeats blocks 510 to 524 from top to bottom, to the cell 110_2, the cell 110_3, and so on. When it is determined in block 522 that the cell 110_J is the last cell (e.g., J is equal to N), the method goes to block 526.

In block 526, the control unit 124 determines whether all the cells 110_1 to 110_N do not have an open cell failure. If any cell has an open cell failure, then the method returns to block 504.

In block 528, if all the cells do not have an open cell failure, then the control unit 124 determines that the open cell failure of the battery management system 120 has been recovered.

Advantageously, the open cell detection method in the battery management system according to the present invention can quickly detect an open cell failure in the battery management system and detect whether the open cell failure is recovered, and efficiently avoid missing an open cell failure or incorrectly identifying the existence of an open cell failure.

While the foregoing description and drawings represent embodiments of the present invention, it will be understood that various additions, modifications, and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. An open cell detection method in a battery management system, wherein said battery management system comprises a plurality of monitoring resistors corresponding to a plurality of cells, a plurality of capacitors, a plurality of balance switches and a plurality of balance resistors; wherein a first cell in said plurality of cells corresponds to a first monitoring resistor, a second monitoring resistor, a first capacitor, a first balance switch and a first balance resistor; and wherein said open cell detection method comprises:
   (a) generating a first control signal with a control unit, to turn on said first balance switch for a first time period;
   (b) generating a second control signal with said control unit, to turn off said first balance switch for a second time period, wherein said second time period follows said first time period;
   (c) measuring a voltage value on said first capacitor at the end of said second time period, with a measure unit coupled to said control unit;
   (d) if said voltage value on said first capacitor is less than an open cell threshold, then determining with said control unit that said first cell has an open cell failure;
   (e) for each cell of said plurality of cells, repeating steps (a)-(d); and
   (f) if at least one cell of said plurality of cells has an open cell failure, then determining, with said control unit, that said battery management system has an open cell failure,
   wherein said method further comprises:
      if there is not an over-temperature situation, then further determining, with said control unit, whether said plurality of cells are being charged;
      if said plurality of cells are not being charged, then further determining, with said control unit, whether there is an under-voltage situation;
      if there is said under-voltage situation, then further determining, with said control unit, whether it is a first time said under-voltage situation has occurred; and
      if it is not the first time, then clearing, with said control unit, an open cell detection timer again.

2. The open cell detection method according to claim 1, wherein each cell of said plurality of cells has a battery protection threshold, and wherein said open cell threshold is set between 3/5 and 9/10 of said battery protection threshold.

3. The open cell detection method according to claim 1, wherein before said step (a), said method further comprises:
   clearing, with said control unit, said open cell detection timer;
   determining, with said control unit, whether said open cell detection timer has ended;
   if said open cell detection timer has ended, then further determining, with said control unit, whether there is said over-temperature situation; and
   if there is said over-temperature situation, then clearing, with said control unit, said open cell detection timer again.

4. The open cell detection method according to claim 1, wherein said first cell is the bottommost cell, and wherein said step (e) comprises:
   repeating steps (a)-(d) from bottom cell to top cell, until steps (a)-(d) are performed for the topmost cell of said plurality of cells.

5. The open cell detection method according to claim 1, wherein said first cell is the topmost cell, and wherein said step (e) comprises:
   repeating steps (a)-(d) from top cell to bottom cell, until steps (a)-(d) are performed for the bottommost cell of said plurality of cells.

6. The open cell detection method according to claim 1, wherein said step (d) further comprises:
   if said voltage value on said first capacitor is greater than or equal to said open cell threshold, then determining, with said control unit, that said first cell does not have an open cell failure.

7. The open cell detection method according to claim 1, wherein after said step (f), said method further comprises:
   disabling the charging of said plurality of cells; and
   generating, with said control unit, an alert to unplug a charger coupled to said plurality of cells.

8. An open cell detection system in a battery management system, wherein said battery management system comprises a plurality of monitoring resistors corresponding to a plurality of cells, a plurality of capacitors, a plurality of balance switches and a plurality of balance resistors; wherein a first cell in said plurality of cells corresponds to a first monitoring resistor, a second monitoring resistor, a first capacitor, a first balance switch and a first balance resistor; wherein said open cell detection system comprises:
   a control unit; and
   a measure unit, coupled to said control unit;
   wherein said open cell detection system is configured to execute a method comprising:
      (a) generating a first control signal with said control unit, to turn on said first balance switch for a first time period;
      (b) generating a second control signal with said control unit, to turn off said first balance switch for a second time period wherein said second time period follows said first time period;
      (c) measuring a voltage value on said first capacitor at the end of said second time period, with said measure unit;
      (d) if said voltage value on said first capacitor is less than an open cell threshold, then determining with said control unit that said first cell has an open cell failure;
      (e) for each cell of said plurality of cells, repeating steps (a)-(d); and
      (f) if at least one cell of said plurality of cells has an open cell failure, then determining, with said control unit, that said battery management system has an open cell failure,
   wherein said method further comprises:
      if there is not an over-temperature situation, then further determining, with said control unit, whether said plurality of cells are being charged;
      if said plurality of cells are not being charged, then further determining, with said control unit, whether there is an under-voltage situation;
      if there is said under-voltage situation, then further determining, with said control unit, whether it is a first time said under-voltage situation has occurred; and if it is not the first time, then clearing, with said control unit, an open cell detection timer again.

9. The open cell detection system according to claim 8, wherein each cell of said plurality of cells has a battery protection threshold, and wherein said open cell threshold is set between ⅗ and 9/10 of said battery protection threshold.

10. The open cell detection system according to claim 8, wherein before said step (a), said method further comprises:
clearing, with said control unit, said open cell detection timer;
determining, with said control unit, whether said open cell detection timer has ended;
if said open cell detection timer has ended, then further determining, with said control unit, whether there is said over-temperature situation; and
if there is said over-temperature situation, then clearing, with said control unit, said open cell detection timer again.

11. The open cell detection system according to claim 8, wherein said first cell is the bottommost cell, and wherein said step (e) comprises:
repeating steps (a)-(d) from bottom cell to top cell, until steps (a)-(d) are performed for the topmost cell of said plurality of cells.

12. The open cell detection system according to claim 8, wherein said first cell is the topmost cell, and wherein said step (e) comprises:
repeating steps (a)-(d) from top cell to bottom cell, until steps (a)-(d) are performed for the bottommost cell of said plurality of cells.

13. The open cell detection system according to claim 8, wherein said step (d) further comprises:
if said voltage value on said first capacitor is greater than or equal to said open cell threshold, then determining, with said control unit, that said first cell does not have an open cell failure.

14. The open cell detection system according to claim 8, wherein after said step (f), said method further comprises:
disabling said charging of said plurality of cells; and
generating, with said control unit, an alert to unplug a charger coupled to said plurality of cells.

15. A system, comprising:
a plurality of monitoring resistors corresponding to a plurality of cells;
a plurality of capacitors;
a plurality of balance switches;
a plurality of balance resistors, wherein a first cell in said plurality of cells is coupled to a first monitoring resistor of said plurality of monitoring resistors, a second monitoring resistor of said plurality of monitoring resistors, a first capacitor of said plurality of capacitors, a first balance switch of said plurality of balance switches, and a first balance resistor of said plurality of balance resistors;
a control unit coupled to said plurality of balance switches; and
a measure unit, coupled to said control unit and said plurality of capacitors;
wherein said system is configured to execute a method comprising:
(a) generating a first control signal with said control unit, to turn on said first balance switch for a first time period;
(b) generating a second control signal with said control unit, to turn off said first balance switch for a second time period, wherein said second time period follows said first time period;
(c) measuring a voltage value on said first capacitor at the end of said second time period, with said measure unit;
(d) if said voltage value on said first capacitor is less than an open cell threshold, then determining with said control unit that said first cell has an open cell failure;
(e) for each cell of said plurality of cells, repeating steps (a)-(d); and
(f) if at least one cell of said plurality of cells has an open cell failure, then determining, with said control unit, that there is an open cell failure;
wherein said method further comprises:
if there is not an over-temperature situation, then further determining, with said control unit, whether said plurality of cells are being charged;
if said plurality of cells are not being charged, then further determining, with said control unit, whether there is an under-voltage situation;
if there is said under-voltage situation, then further determining, with said control unit, whether it is a first time said under-voltage situation has occurred; and
if it is not the first time, then clearing, with said control unit, an open cell detection timer again.

16. The system according to claim 15, wherein before said step (a), said method further comprises:
clearing, with said control unit, said open cell detection timer;
determining, with said control unit, whether said open cell detection timer has ended;
if said open cell detection timer has ended, then further determining, with said control unit, whether there is said over-temperature situation; and
if there is said over-temperature situation, then clearing, with said control unit, said open cell detection timer again.

17. The system according to claim 15, wherein said first cell is the bottommost cell, and wherein said step (e) comprises:
repeating steps (a)-(d) from bottom cell to top cell, until steps (a)-(d) are performed for the topmost cell of said plurality of cells.

18. The system according to claim 15, wherein said first cell is the topmost cell, and wherein said step (e) comprises:
repeating steps (a)-(d) from top cell to bottom cell, until steps (a)-(d) are performed for the bottommost cell of said plurality of cells.

19. The system according to claim 15, wherein said step (d) further comprises:
if said voltage value on said first capacitor is greater than or equal to said open cell threshold, then determining, with said control unit, that said first cell does not have an open cell failure.

20. The system according to claim 15, wherein after said step (f), said method further comprises:
disabling said charging of said plurality of cells; and
generating, with said control unit, an alert to unplug a charger coupled to said plurality of cells.

* * * * *